(12) United States Patent
Giaccio et al.

(10) Patent No.: US 10,546,620 B2
(45) Date of Patent: Jan. 28, 2020

(54) DATA STROBE CALIBRATION

(71) Applicant: Micron Technology, Inc., Boise, ID (US)

(72) Inventors: Claudio Giaccio, Torre del Greco (IT); Ferdinando Pascale, Ottaviano (IT); Erminio Di Martino, Quarto (IT); Raffaele Mastrangelo, S. Anastasia (IT); Ferdinando D'Alessandro, Nola (IT); Andrea Castaldo, Portici (IT); Cristiano Castellano, Volturara Irpina (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/022,351

(22) Filed: Jun. 28, 2018

(65) Prior Publication Data

US 2020/0005840 A1 Jan. 2, 2020

(51) Int. Cl.
*G06F 3/06* (2006.01)
*G11C 7/22* (2006.01)

(52) U.S. Cl.
CPC .............. *G11C 7/22* (2013.01); *G06F 3/0604* (2013.01); *G06F 3/0611* (2013.01); *G06F 3/0629* (2013.01); *G06F 3/0679* (2013.01); *G11C 2207/2254* (2013.01)

(58) Field of Classification Search
CPC ........................................................ G11C 7/22
See application file for complete search history.

(56) References Cited

U.S. PATENT DOCUMENTS

| | | | | |
|---|---|---|---|---|
| 6,041,417 A | * | 3/2000 | Hammond | G06F 13/423 375/362 |
| 2007/0274137 A1 | * | 11/2007 | Park | G11C 7/1051 365/189.07 |
| 2010/0169699 A1 | * | 7/2010 | Fujimoto | G06F 13/4291 713/503 |
| 2014/0082397 A1 | * | 3/2014 | Shin | G06F 1/10 713/401 |
| 2019/0187929 A1 | * | 6/2019 | Srivastava | G06F 3/0659 |

OTHER PUBLICATIONS

"JESD84-B51 Embedded Multi-Media Card (e•MMC) Electrical Standard (5.1)", JEDEC Solid State Technology Association Revision of JESD84-B50.1, (Jul. 2014), 356 pgs.

* cited by examiner

*Primary Examiner* — Edward J Dudek, Jr.
(74) *Attorney, Agent, or Firm* — Schwegman Lundberg & Woessner, P.A.

(57) ABSTRACT

Devices and techniques are disclosed herein for determining, using a host device, a timing relationship between a data strobe signal, such as from an embedded MultiMediaCard (eMMC) device, and an internal clock signal. The host device can control a delay circuit using the determined timing relationship, such as to align received read data for sampling, or to determine or adjust a delay value of the delay circuit.

23 Claims, 7 Drawing Sheets

DATA STROBE CALIBRATION

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The Joint Electron Device Engineering Council (JEDEC) has promulgated numerous interface and communication standards for embedded MultiMediaCard (eMMC™) devices, including the JEDEC standard D84-B51 (JESD84-A51), commonly referred to as JEDEC eMMC standard 5.1.

The present inventors have recognized, among other things, that a host device can determine a timing relationship between a data strobe signal and an internal clock signal to align read data for sampling. In other examples, a data strobe pin can be used to provide data to the host device, or a multiplexer circuit can be configured to provide a data strobe signal to the host device in a calibration mode and a data signal to the host device in a data read mode.

Figure 1:
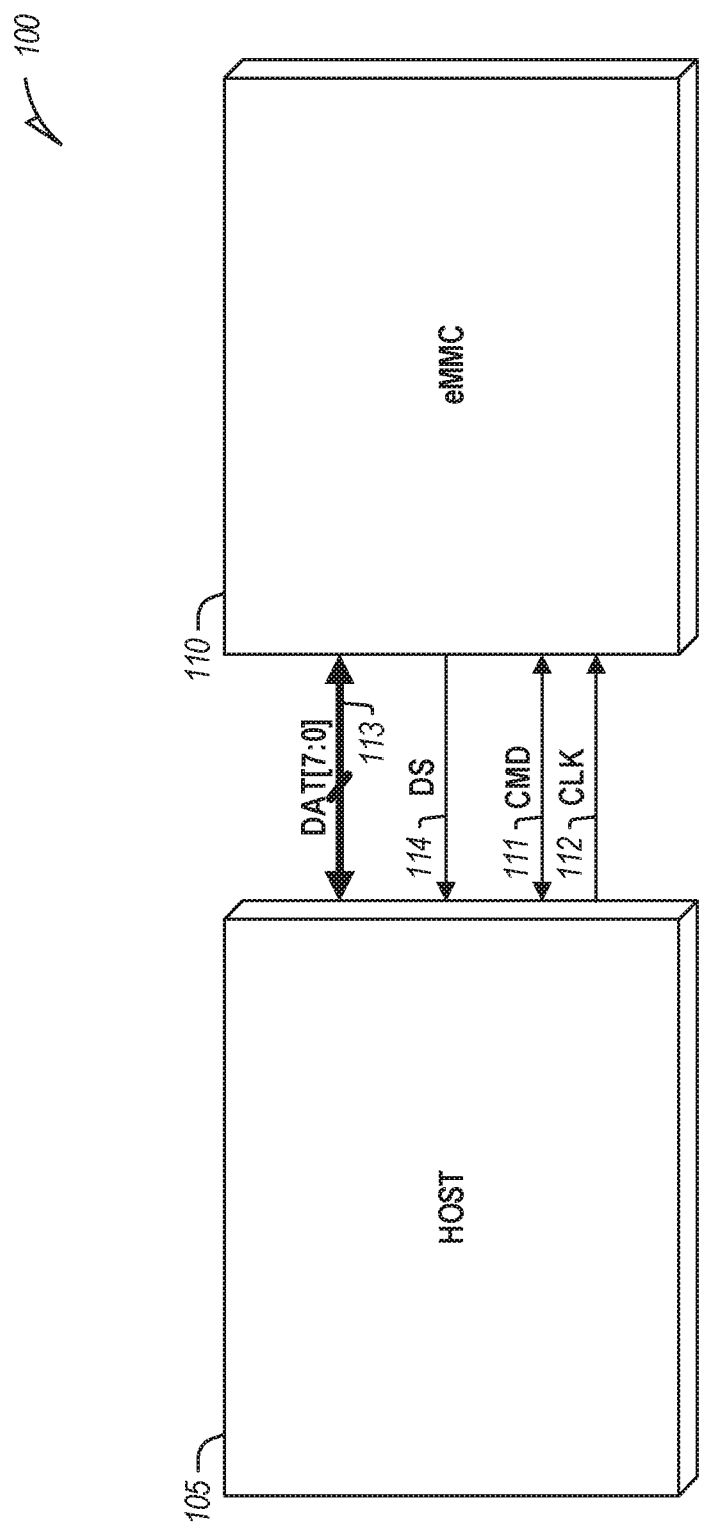
FIGS. 1-5 illustrate example embedded MultiMediaCard (eMMC™) systems, or portions of eMMC systems, including a host device, an eMMC device, and a communication interface.

FIG. 1 illustrates an example eMMC system 100 including a host 105 and an eMMC 110. The host 105 can include a host processor, a central processing unit, or one or more other processor or controller, such as in an electronic (or host) device. The host 105 and the eMMC 110 can communicate using a communication interface including one or more bidirectional command and data lines (e.g., a command line (CMD) 111, data lines (DAT[7:0]) 113, etc.), such as defined in one or more JEDEC standards. To synchronize communication of data between the eMMC 110 and the host 105, such as over the eight parallel data lines 113 illustrated in FIG. 1, the host 105 can provide a clock signal to the eMMC 110, for example, using a clock line (CLK) 112. In other examples, the communication interface one or more other lines (not shown), such as reset, power/voltage levels (e.g., VCC, VSS, etc.), etc.

Each of the host 105 and the eMMC 110 can include a number of receiver or driver circuits configured to send or receive signals over the communication interface (e.g., command, data, or one or more other lines, such as CMD, DAT[7:0], CLK, etc.), or interface circuits, such as data control units, sampling circuits, or other intermedia circuits configured to process data to be communicated over, or otherwise process data received from the communication interface for use by the host 105, the eMMC 110, or one or more other circuits or devices.

The eMMC 110 can include a memory array (e.g., one or more arrays of memory cells, such as a NAND flash memory array, or one or more other memory arrays) and a memory controller. The memory controller can include an application specific integrated circuit (ASIC), a field programmable gate array (FPGA), or one or more other processing circuits arranged or programmed to manage data transfers or operations to, from, or within the memory array.

In a read operation, the eMMC 110 can provide data (e.g., read data) from the memory array to the data lines 113 according to the clock signal on the clock line 112 from the host 105 (e.g., at rising edges of the clock signal, falling edges of the clock signal, or both rising and falling edges of the clock signal). However, as the data lines 113 are imperfect conductors having resistance, inductance, and capacitance, transitions on the data lines 113 from high to low, or low to high, when they occur (the value of a data line may remain constant for multiple clock transitions), take time. Further, as the working frequency of the eMMC 110 increases, the clock period decreases (in certain examples, approaching the propagation delay), and thus, the time period for sampling the data lines 113 becomes smaller. Accordingly, as the sampling time decreases, synchronizing communication between the host 105 and the eMMC 110, such as to avoid sampling during transitions, can become challenging. To improve synchronization, the JEDEC eMMC standard 5.0 introduced a data strobe signal from the eMMC 110 to the host 105.

During high-speed modes (e.g., HS400, with double data rate (DDR) transfer of data at both rising and falling edges of a 200 MHz clock signal (400 MB/s), etc.), the eMMC 110 can provide a data strobe signal on a data strobe line (DS) 114 to the host 105, the data strobe signal synchronous to data transitions on the data lines 113, such as to assist with sampling (e.g., use as a clock signal at the host 105, etc.). However, this presents several issues. For example, the data strobe signal is only provided in a high-speed mode (e.g., HS400), and is thus not present for all operations requiring sampling at the host 105. One solution is to multiplex the data strobe signal and the internal clock signal at the host 105. However, in certain technologies (e.g., FPGA), it can be challenging to switch the multiplexer circuit fast enough to not lose data or introduce errors at sampling (e.g., losing sampling edges, etc.). Moreover, the data strobe disappears at the end of the high-speed data read, when the internal data path within the host 105 must continue to operate. Accordingly, there may not be enough data strobe clock cycles to implement synchronization of the internal clock and the data strobe signal. In other technologies (e.g., ASIC), synchronizing data transitions from a data strobe to the clock can still be an issue. Moreover, using the data strobe as a clock signal requires substantial architecture changes, in certain examples requiring a substantial amount of effort, including high development and time costs.

The present inventors have recognized, among other things, that the host 105 can determine a timing relationship between the data strobe signal and an internal clock signal (e.g., the clock signal from the clock line 112), such as to align read data on the data lines 113 for sampling, for example, using one or more delay circuits. The host 105 can use the data strobe signal to determine the transition time of the data on the data lines 113, and accordingly, the propagation delay between the eMMC 110 and the host 105. The host 105 can use the transition time, or the propagation delay, to determine a sampling time (e.g., the data strobe transition time plus a delay, such as a portion of the clock period, etc.), such as to avoid sampling during data strobe transitions, and accordingly, data line transitions.

Figure 2:
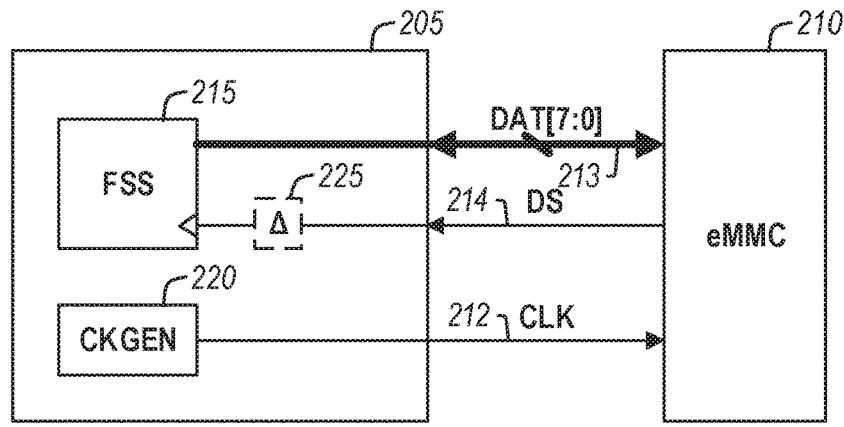

FIG. 2 illustrates an example portion of an eMMC system 200 including a host 205, an eMMC 210, and a communication interface including a clock line (CLK) 212, data lines (DAT[7:0]) 213, and a data strobe line (DS) 214. The host 205 can include a clock generator circuit (CKGEN) 220 configured to provide a clock signal to the eMMC 210 using the clock line 212. The communication interface can include one or more additional lines, not shown, such as a command line (CMD), a reset line (RESET), etc.

The eMMC 210 can include a memory array and a memory controller, and can provide data from the memory array to the host 205, or receive data from the host 205 to be stored on the memory array, using the data lines 213 according to the clock signal on the clock line 212. The eMMC 210 can sample data received on the data lines 213 according to the data strobe signal, or provide data to the data lines 213 according to the clock signal. Although the host 205 provides the clock signal, the propagation delay between the host 205 and the eMMC 210 can be unknown, and in certain examples, can change under various conditions (e.g., temperature changes, supply voltage levels, etc.), including within or during long read operations. Accordingly, the eMMC 210 can provide a data strobe signal corresponding to data transitions (where applicable) on the data lines 213. The data strobe signal can be related to the clock signal from the host 205, the propagation delay of the communication interface between the host 205 and the eMMC 210, and any processing delay within the eMMC 210 (e.g., between the memory controller and the memory array, etc.).

The host 205 can include a first sampling stage circuit (FSS) 215 configured to sample data on the data lines 213. The FSS circuit 215 can be configured to apply a delay to the data strobe signal, or to receive a delayed data strobe signal from a first delay circuit 225 (e.g., a programmable, selectable, adjustable, or other analog or digital delay circuit, such as an FPGA delay component configured to provide a configurable delay). In certain examples, the delay circuits referred to herein can be a component of the host 205, or in other examples, can be an external component separate from but between the host 205 and the eMMC 210, but controlled by general-purpose input/output (IO) of the host 205.

However, even as the JEDEC eMMC standards now provide for a data strobe signal for high-speed modes, the data strobe signal is not required in low-speed modes (e.g., HS, HS200 (200 MB/s at 200 MHz, etc.), or any mode of communication or data transfer slower than a high-speed mode (e.g., HS400, etc.). In certain examples, the data strobe signal is not provided in low-speed modes. If an eMMC is not in high-speed mode (e.g., HS400, etc.), the data lines must be sampled using the clock signal. Accordingly, eMMC systems continue to support previous methods of sampling data lines. Further, certain vendors, systems (e.g., hosts, eMMC devices, etc.), or other hardware or software remain incompatible with the data strobe feature. Certain vendors refuse to add another pin on the host or the eMMC device, or another line on the communication interface, or refuse to update or modify existing features, hardware, or software to support the feature. Even in systems that support the data strobe feature, if such feature is used only during high-speed modes, use may be intermittent, such that calibration remains an issue.

In other examples, low- and high-speed modes can refer to lower that do not require a data strobe signal or calibration, and separately, higher speeds higher than the lower speeds that do require a data strobe signal or calibration for effective communication, e.g., without data sampling errors. In other examples, low and high-speed modes can refer to SDR sampling and DDR sampling, respectively.

Certain eMMC systems or components (e.g., hosts, eMMC devices, memory controllers, memory arrays, etc.) are capable of operating in high-speed modes (e.g., HS400, etc.), but do not support the data strobe feature, for example, in hardware or software. The present inventors have recognized, among other things, that certain eMMC systems or components without the data strobe feature (e.g., the data strobe signal, data strobe line, or software controlling such feature, etc.) can be calibrated for high-speed communication. In other examples, the data strobe line 214 (e.g., after calibration) can be reallocated as an additional data line (e.g., DAT[8], etc.).

Figure 3:
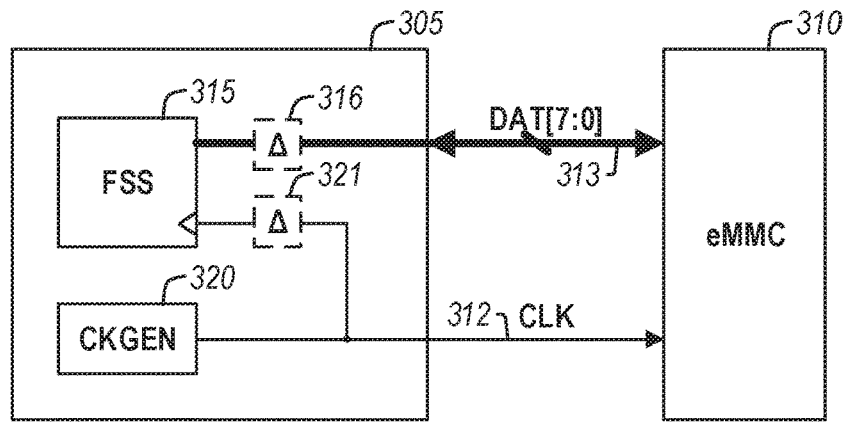

FIG. 3 illustrates an example portion of an eMMC system 300 including a host 305, an eMMC 310, and a communication interface including a clock line (CLK) 312 and data lines (DAT[7:0]) 313. The host 305 can include a first sampling stage circuit (FSS) 315 or other sampling circuit configured to sample data on the data lines 313, and a clock generator circuit (CKGEN) 320 configured to provide a clock signal to the eMMC 310 using the clock line 312.

In the absence of a data strobe signal or a data strobe line (or in certain examples, in combination therewith), the host 305 can include one or both of a data delay circuit 316 configured to delay the data from the data lines 313, or a clock delay circuit 321 configured to delay the clock signal from the clock generator circuit 320, such that the first sampling stage circuit 315 is configured to sample the data lines 313 outside of the transition periods of the data signals, accounting for propagation or other delay between the host 305 and the eMMC 310 or within the host 305 or the eMMC 310. In certain examples, one or both of the data delay circuit 316 or the clock delay circuit 321 can be determined using detected error rates (e.g., of known sample data, for example, including transitions at every clock cycle, or a known transition pattern, etc.), sampling at different delay values to determine transition periods, or one or more other method to determine transitions on the data lines 313. The delay of the delay circuits (e.g., the data delay circuit 316 or the clock delay circuit 321) can be configurable, the values selected by comparing results over one or more read operations.

However, whereas certain data modes, such as HS200, provide a dedicated data block having a known pattern for tuning communication variables, such as delay circuits, propagation delay, etc., the HS400 mode does not provide such dedicated data block. Further, during long read operations or other use conditions, operating conditions may change (e.g., temperature, supply voltage, etc.), such that the location of a valid data window may change with respect to the sampling clock of the host 305. When in use, a data strobe signal tracks changes in operating conditions. However, when intermittently using the data strobe signal to calibrate the propagation delay, the calibration can either be regularly checked (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.). In between calibration, the data strobe line (such as illustrated in FIGS. 1 and 2) can be used to transfer data between the eMMC 310 and the host 305 (e.g., from the eMMC 310 to the host 305 in response to a read command, etc.).

In other examples, one or more of the host 305, the eMMC 310, or the communication interface can include a data strobe line, a data strobe pin, or a data strobe signal. However, in certain examples, one or more component of the eMMC system 300 may not support the data strobe signal. In such conditions, the data strobe line can be used to transfer data from the eMMC 310 to the host 305, while calibrating the propagation delay between the eMMC 310 and the host 305, and thus, the delay of one or more delay circuits, using one or more other methods, such as sampling at different delay values, or comparing results over one or more read operations, etc.

Figure 4:
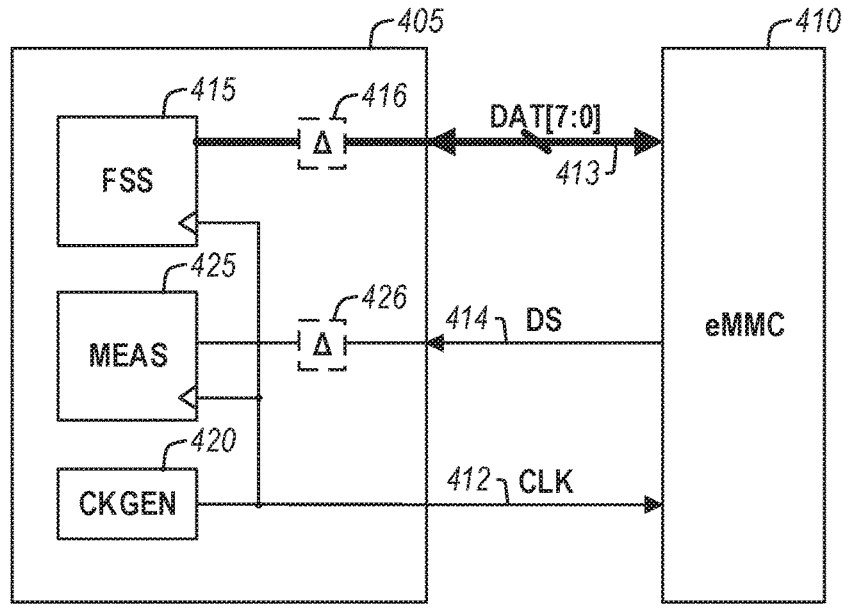

FIG. 4 illustrates an example portion of an eMMC system 400 including a host 405, an eMMC 410, and a communication interface including a clock line (CLK) 412, data lines (DAT[7:0]) 413, and a data strobe line (DS) 414. The host 405 can include a first sampling stage circuit (FSS) 415 or other sampling circuit configured to sample data on the data lines 413, a clock generator circuit (CKGEN) 420 configured to provide a clock signal to the eMMC 410 using the clock line 412, and a measurement circuit (MEAS) 425, implemented in hardware, software, or a combination of hardware or software.

In an example, the measurement circuit 425 can be configured to evaluate the value of a delay to apply to a delay circuit, such as a data delay circuit 416 configured to delay the data on the data lines 414 before reaching the first sampling stage circuit 415. The measurement circuit 425 can receive the clock signal from the clock generator circuit 420, and a data strobe signal from the eMMC 410, and can determine a propagation delay between the clock signal at the host 405 and the data strobe signal received from the eMMC 410. The measurement circuit 425 can determine the delay as a function of the alignment of transitions on the clock signal and the data strobe signal, or can be configured to select one of a plurality of predetermined delays, such as using a best fit analysis, or a closest fit between the propagation delay and one or more predetermined delay values. In an example, a result of the measurement circuit 425 can be evaluated, such as by a host processor or one or more other component of the host 405, either in software or hardware. The data delay circuit 416 can be a component of the first sampling stage circuit 415, or a separate component, as illustrated in FIG. 4, and can be controlled by the measurement circuit 425 or one or more other component of the host 405.

In HS400 mode, the data strobe signal represents a dual data rate (DDR) pattern of data, continuously switching (1-0-1-0- . . . ) at each clock edge, rising and falling, representing a critical pattern to test the sampling capability of the host 405. The data strobe signal pattern is independent to data on an accessed block of the eMMC 410. In certain examples, the first sampling stage circuit 415 can remain unchanged, and a data delay circuit 416 can be applied to the data lines 413, but the value of the delay can be measured using the data strobe signal. The measurement circuit 425 can evaluate the data strobe signal on the data strobe line 414, use the data strobe signal to determine the delay for the data delay circuit 416 (e.g., alignment of the data strobe signal to the clock signal, etc.). Then, after the delay is determined, a data strobe delay circuit 426 can apply a delay to the data strobe line 413 (e.g., equal to the delay of the data delay circuit 416). The data strobe line 413, when not in use for calibration of the propagation delay between the host 405 and the eMMC 410, can be used as an additional data line (e.g., DAT8) between the eMMC 410 and the host 405, such as for read, write, or one or more other memory or data transfer operations. When intermittently using the data strobe signal to calibrate the propagation delay, the calibration can either be regularly checked (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.). In certain examples, the delay of one or more of the delay circuits can be evaluated, determined, or executed by hardware, software, or a combination thereof.

In other examples, in a system not having the data strobe feature, one of the data lines 413 can provide a data strobe signal to the host 405 for calibration purposes, for example, providing a pattern of data, continuously switching (1-0-1-0- . . . ) at each clock edge, rising and falling, such that one of the data lines 413 (e.g., DAT0, DAT7, etc.) can be used to calibrate the sampling capability of the host 405. In an example, the data lines 413 can be used to calibrate the propagation delay between the host 405 and the eMMC 410. When intermittently using the data line to calibrate the propagation delay, the calibration can either be regularly checked (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.).

In an example, the measurement circuit 425 can determine the delay or alignment between the clock signal and the data strobe, and either provide a delay to the delay circuits or other components of the host 405, or provide delay or alignment information to one or more other component of the host 405, such as the host processor or other component. In an example, after the value of the delay is determined, the measurement circuit 425 can evaluate drift of the data strobe signal at every read operation, at regular intervals, or at one or more other trigger conditions (e.g., detected errors, temperature, supply voltage, etc.). The measurement circuit 425 can provide drift information to one or more other system components, such as a host processor or other circuit, to evaluate the delay for adjustment of the delay circuits, e.g., due to drift, etc.

Figure 5:
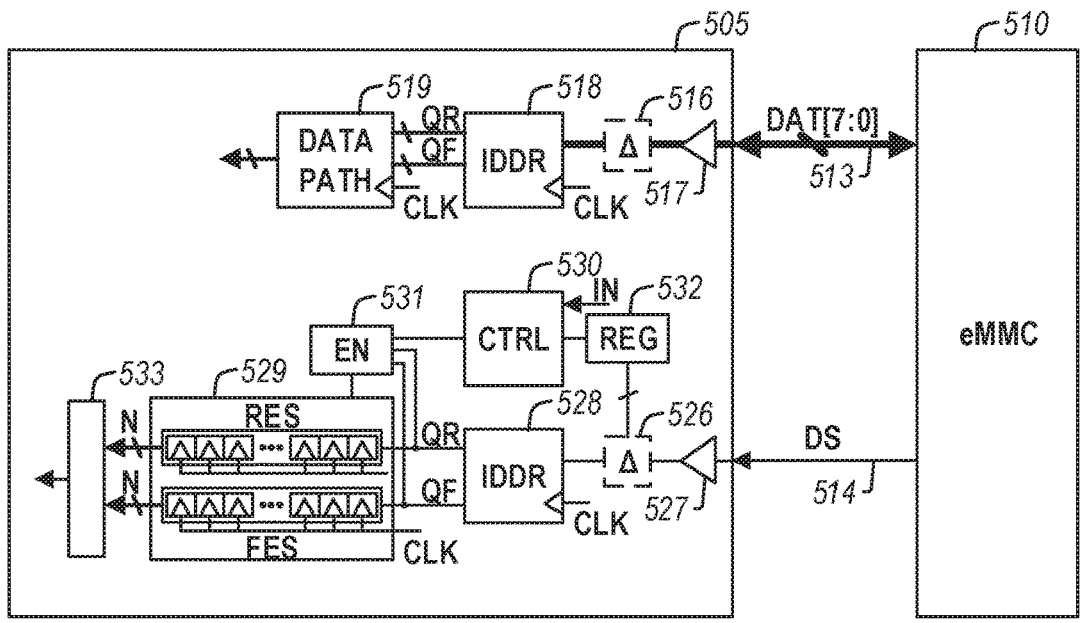

FIG. 5 illustrates an example portion of an eMMC system 500 including a host 505, an eMMC 510, a communication interface including data lines (DAT[7:0]) 513 and a data strobe line (DS) 514, and sample hardware to sample a data strobe signal on the data strobe line 514. One or more components illustrated in FIG. 5 can be included as part of, or separate from, the first sampling stage illustrated in previous figures.

In an example, the host 505 can provide a command to the eMMC 510 to begin a high-speed mode (e.g., HS400), for example, using a command line. In response, the eMMC 510 can provide a data strobe signal to the data strobe line 514. The host 505 can include a data strobe input buffer 527 to receive a data strobe signal on the data strobe line 514 from the eMMC 510, and a data strobe delay circuit 526 configured to provide a configurable delay or one of a number of predetermined or selectable delays to the data strobe signal. In certain examples, the data strobe delay circuit 526 (or one or more other delay circuits) can be configured with an initial or trial value, such as before calibration, or according to a previous calibration or a default or nominal value. The host 505 can be configured to alter the value of the delay of the data strobe delay circuit 526 and sample the values of the data strobe signal across different delay values to optimize the value of the delay of the data strobe delay circuit 526, and accordingly, the value of the delay for sampling data or command signals on the data lines or one or more command lines, respectively.

The host 505 can include a first input double data rate circuit (IDDR) 528 configured to receive the data strobe signal and a clock signal (CLK), and, if the data strobe signal is a double data rate (DDR) signal, sample the data strobe signal on rising and falling clock cycles, and provide a value on the rising edge of the clock signal (QR) and a value on the falling edge of the clock signal (QF). In other examples, the system can include a delay on the clock signal instead of, or in addition to, the delay on the data strobe signal. A sampling register 529 (e.g., a serial-to-parallel shift register) can receive the DDR data from the IDDR 528 and a clock signal (CLK), and sample a given number of values for a number of clock cycles, for example, in a rising edge sample register (RES) and a falling edge sample register (FES). The sampling register can provide an output, such as one or more parallel outputs of N samples (e.g., N being less than the number of data strobe cycles in a signal data block of the eMMC 510, such as 256, etc.). In an example, a check circuit 533 can determine if the pattern sampled by the sampling register 529 is consistent with an expected pattern, and a propagation delay, alignment, or drift between the data strobe signal and the clock signal can be determined using an output of the check circuit 533. In other examples, one or more other components can receive the data strobe signal and determine, using hardware or software, the propagation delay, alignment, or drift between the data strobe signal and the clock signal.

A control circuit 530 (e.g., control logic) can receive input from an external user, or from one or more other host 505 or eMMC 510 component or process, to control one or more of the components herein. For example, the control circuit can control an enable circuit 531 configured to enable or control one or more process or aspect of the sampling register 529. In an example, the value of the data strobe signal is a low value ("0") until data transfer begins. Accordingly, the enable circuit 531 can monitor the output of the IDDR 528 for a high value ("1") (or a number of high values or toggles) before enabling the sampling register 529.

The control circuit 530 can provide a signal to an input delay register 532 configured to control a delay of the data strobe delay circuit 526. In general, the number of steps or value of steps configurable by the input delay register 532 (or other delay register or delay circuit) can be configured to cover at least one clock period. For example, the data strobe delay circuit 526 can be configured with a number of possible values (e.g., 32) and can cover an entire clock period (e.g., 200 MHz (5 ns)). In other examples, other values or number of values can be used. Table 1 illustrates example delay taps for the data strobe delay circuit 526 or the input delay register 532.

TABLE 1

Input delay codes

| Tap | Input delay (5-bit code) | Input delay (ps) |
|---|---|---|
| 0 | 00000 | 0.00 |
| 1 | 00001 | 156.25 |
| 2 | 00010 | 312.50 |
| 3 | 00011 | 468.75 |
| 4 | 00100 | 625.00 |
| 5 | 00101 | 781.25 |
| 6 | 00110 | 937.50 |
| 7 | 00111 | 1093.75 |
| 8 | 01000 | 1250.00 |
| . . . | . . . | . . . |
| 23 | 10111 | 3593.75 |
| 24 | 11000 | 3750.00 |
| 25 | 11001 | 3906.25 |
| 26 | 11010 | 4062.50 |
| 27 | 11011 | 4218.75 |
| 28 | 11100 | 4375.00 |
| 29 | 11101 | 4531.25 |

TABLE 1-continued

Input delay codes

| Tap | Input delay (5-bit code) | Input delay (ps) |
|---|---|---|
| 30 | 11110 | 4687.50 |
| 31 | 11111 | 4843.75 |

In certain examples, it can be important (such as in FPGA technology), to maintain a consistent delay across the communication interface and within the host 505, that the circuit path of the different communication interface components are similar, such that the total delay added by routing the signals through the circuit paths are not substantially different for the information on the data lines 513 in contrast to one or more of the data strobe line 514 or one or more command lines (not shown). As each component and process within the circuit has an associated delay, a similar circuit path, where possible, can be advantageous. Further, similar components within a system can provide other benefits, such as consistent fabrication processes, and in certain examples, shared system resources or other benefits of duplication of components or processes.

Accordingly, the host 505 can include a data input buffer 517, a data delay circuit 516, and a second IDDR 518, similar to the components of the data strobe line circuit path described above, configured to sample data signals (e.g., read data) on the data lines 513. Further, the host 505 can include one or more data path circuits 519 configured to receive the output of the second IDDR 518 and manage and provide data from the data lines to one or more other component of the host 505. In an example, to maintain consistent delays across the one or more command lines or other lines of the communication interface, such circuit paths can include similar components within the host 505. If the one or more command lines or other lines are not configured to receive DDR signals, an IDDR circuit can be included in the data path, but one of the two outputs of an IDDR circuit can be ignored to maintain consistent delays within and across the host 505.

In other examples, the different circuit paths within the host 505 (e.g., the data strobe signal path, the data line signal path, etc.) can include different components with substantially different delays, and the host 505 can be configured to account for such differences by assigning different delay values to one or more delay circuits (e.g., the data delay circuit 516, the data strobe delay circuit 527, a delay circuit on the one or more command lines, etc.).

In certain examples, the host 505 can be configured to optimize the delay of the data strobe signal while received data from the eMMC 510, without altering or affecting the normal operation of the data lines, as the data strobe delay circuit 526 can be independent from, and independently controlled with respect to one or more other delay circuits, such as the data delay circuit 516, etc. For example, if a delay circuit (e.g., the data strobe delay circuit) has a number of taps across the period of the clock signal (e.g., 32), any read operation (or other operation) as long as or longer than the number of delay taps (e.g., if 32 delay taps, then 32 data blocks or more, etc.) can be used recalibrate, measure, or optimize the value of the delay in the background, while the host 505 receives data on the data lines using the previous delay value. The check circuit 533, or one or more other component, hardware or software, can determine the desired value of the delay signal during normal data operations. In an example, the determined values can be compared to existing values, and, depending on the difference (e.g., if the difference is greater than one full delay tap or otherwise above a threshold amount, in certain examples, having respective thresholds for each delay circuit), updated delay values can be provided to the one or more delay circuits. In certain examples, the delay values can be updated during data operations, at the next data operation, or updated at other regular or triggered intervals. The delay values can be evaluated using hardware or software, and such background optimization can be enabled independently from, or upon the execution of an initial calibration. In other examples, determined values can be stored as reference amounts to compare with subsequent determined values.

In other examples, the determined values or changes can be stored and referenced in the context of data failure, such as to distinguish between data corruption and timing errors, or used to recover from data errors.

Figure 6:
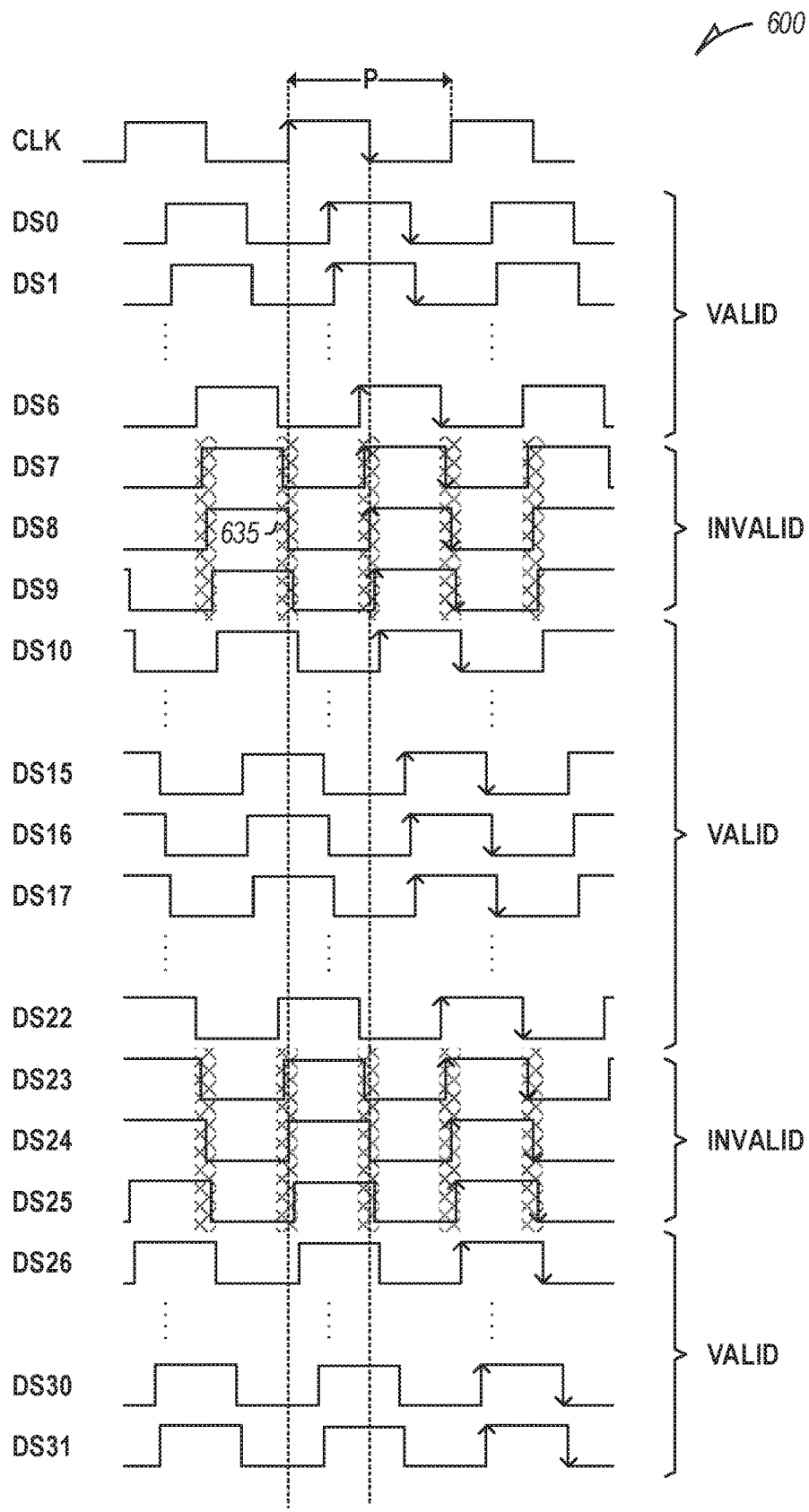
FIGS. 6-8 illustrate example timing diagrams of signals in an eMMC system.

FIG. 6 illustrates an example timing diagram 600 including a clock signal (CLK) having a period (P) (e.g., 5 ns) and rising and falling edges, as illustrated, and different data strobe signals at different delay taps (e.g., DS0 through DS31, output from a data strobe delay circuit, etc.). In this example, 32 taps cover an entire clock period. In other examples, other numbers of delays or taps can be used.

DS0 follows the clock signal by a portion of a clock period (e.g., ¼ of a clock period, 1¼ of a clock period, 2¼ of a clock period, etc.). The amount that DS0 follows the clock signal can vary, depending on, for example, the propagation delay within or between a host and an eMMC or, in certain examples, an initial or previous delay of one or more delay circuits. DS1 follows DS0 by single tap (e.g., 156.25 ps); DS2 follows DS1 by a single tap (e.g., 156.25 ps); etc.

As the transitions of DS0 are offset from the clock signal, such that if the data strobe signal is sampled over a number of clock periods (e.g., N) at the rising and falling edges of the clock signal, the output of a sampling register (e.g., the sampling register 529) of DS0 will be all "0" values at a rising edge sample register (RES), and all "1" values at a falling edge sample register (FES).

As the data strobe signal is shifted, such as by additional delay taps, the transitions on the data strobe signal will become sufficiently close to the rising and falling edges of the clock signal, such that setup and hold time violations may occur, leading to errors in the sampled data. In this example, DS1 through DS6 are valid delay taps, with the output of the RES and FES still consistent at "0" and "1", respectively, over the number of clock periods. However, at DS7 through DS9, the transitions of the data strobe signals are sufficiently close to the rising and falling edges of the clock signal such that timing violations may occur (e.g., violation 635), where such that the sampled values in RES and FES may not all be the same values (e.g., one or more of RES or FES will separately hold a mix of "0" and "1" over the number of clock periods, etc.). Accordingly, in FIG. 6, DS7 through DS9 are invalid delay taps.

In this example, DS10 through DS22 are valid delay taps, although whereas the value of RES and FES in DS0 through DS6 are "0" and "1", respectively, in DS10 through DS22, the values of RES and FES have changed to "1" and "0", respectively, indicating a phase change between the data strobe signal and the clock signal. Further, like DS7 through DS9, the transitions in DS23 through DS25 are sufficiently close to the rising and falling edges of the clock signal such that timing violations may occur, and are thus invalid delay taps. DS26 through DS31 are valid delay taps with RES and FES values consistent at "0" and "1", respectively, like in DS0 through DS6.

In an example, the RES and FES values can be checked for each delay tap at each read operation. In certain examples, such as during long read operations, the RES and FES values can be checked in the middle of a read operation. In other examples, the RES and FES values can be checked at regular intervals (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.). Further, the result of the RES and FES values on the data strobe signal are independent of any data stored on the eMMC. As such, in certain examples, using the data strobe signal, pre-conditioning the eMMC content is not required to determine the value of the delay. Once the valid and invalid delay taps are known, the time relationship between the data strobe signal and the clock signal can be determined, and the value of the delay (e.g., of one or more of the data strobe signal, the data signals, the clock signal, etc.) can be set.

In an example, the value of the delay can be set as one of the valid delay taps, in certain examples, at or near the midpoint of the valid range of delay taps, with a desired phase, or in the case of multiple ranges of valid delay taps, at or near the midpoint of the valid range of delay taps having the greater number of successive valid delay taps. In FIG. 6, there are two ranges of valid delay taps, DS26 through DS6 and DS10 through DS22. In an example, the widest range of valid delay taps (e.g., the range of valid delay taps having the greatest number of successive valid taps) can be selected, and the midpoint of the widest range of valid delay taps can be determined as the desired delay tap.

In certain examples, if the delay is adjusted multiple times, such that the direction of the drift can be determined, such as by a check circuit or one or more other component of the host, the value of the delay can be set to minimize errors given the direction of drift or previous alignment. In other examples, the RES and FES values can be checked according to one or more sorting or search algorithms, such as to minimize the time required to determine or estimate the valid and invalid delay taps, or avoid checking each delay tap.

Although described herein with the hardware illustrated in FIG. 5, in other examples, one or more other hardware or software solutions can be used to determine the values of the data strobe signal at different delays, such as to determine the time relationship between the data strobe signal and the clock signal.

Figure 7:
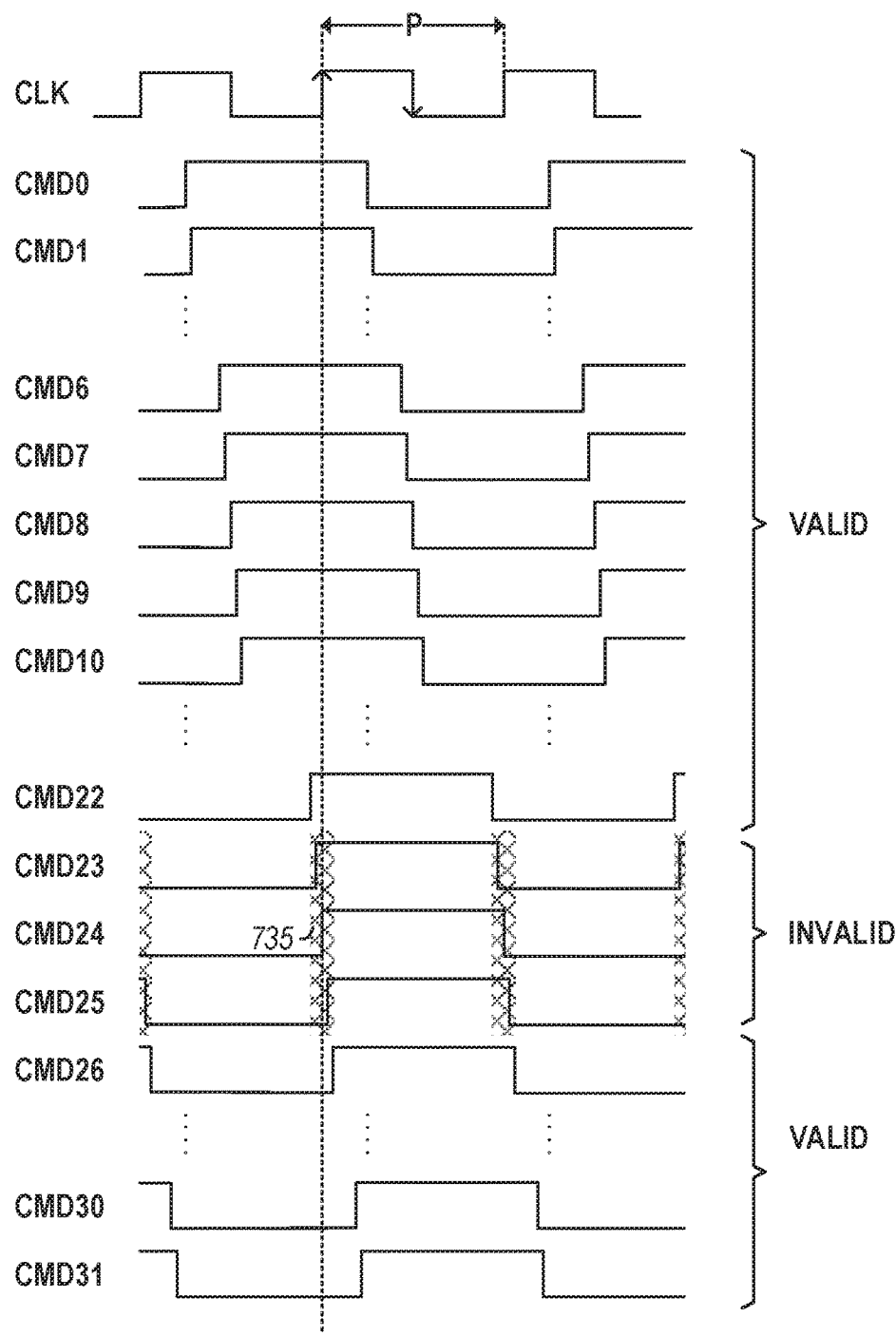

FIG. 7 illustrates an example timing diagram 700 including a clock signal (CLK) having a period (P) (e.g., 5 ns) and rising and falling edges, as illustrated, and different command line signals at different delay taps (e.g., CMD0 through CMD31, output from a command line delay circuit, etc.). In this example, 32 taps cover an entire clock period. In other examples, other numbers of delays or taps can be used.

The JEDEC eMMC standard provides for optional usage of the data strobe signal while receiving a command signal from the eMMC, such as on the command line (e.g., a command line (CMD) 111, etc.) in an enhanced data strobe mode. After a host sends a command to the eMMC, such as using the command signal on the command line, the eMMC can provide a response in single data rate (SDR) mode, which is twice as long as the data strobe signal in double data rate (DDR) mode. In an example, the rising edge of the clock signal can be used as the active edge. In high-speed mode with enhanced data strobe, the transitions of the command signal may occur with the rising edge of the data strobe signal. Moreover, sampling the command signal can be done on the rising edges of the clock signal.

In an example, a host can include circuitry to sample command signals on one or more command lines, similar to that illustrated in FIG. 5 with respect to sampling data signals on the data lines, including, for example, a command input buffer, a command signal delay circuit, an IDDR, and one or more command signal path circuits. In other examples, one or more other components or hardware or software can be used to determine a value of a delay for the command signal. For example, as the command signals are in SDR mode in contrast to the data strobe signal in DDR mode, but the two signals are similar, with similar circuit paths having similar internal delays, the value of the delay for the command line can be selected using the determined value of the delay for the data strobe signal.

In contrast to the data strobe signal (e.g., a DDR signal) timing diagram 600 of FIG. 6, the command signal (e.g., an SDR signal) timing diagram 700 of FIG. 7 has a single range of valid delay taps, CMD26 through CMD22, and a single range of invalid delay taps, CMD23 through CMD 25, where timing violations may occur (e.g., violation 735). Due to the DDR/SDR relationship between the data strobe signal and the command signal, the delay for the command line can be selected as the midpoint of the valid delay tap range (e.g., CMD8), which is the midpoint of the first invalid range from the data strobe signal timing diagram 600 of FIG. 6. Accordingly, the value of the delay for the command line can be selected using the determined delay value for the data strobe signal.

Figure 8:
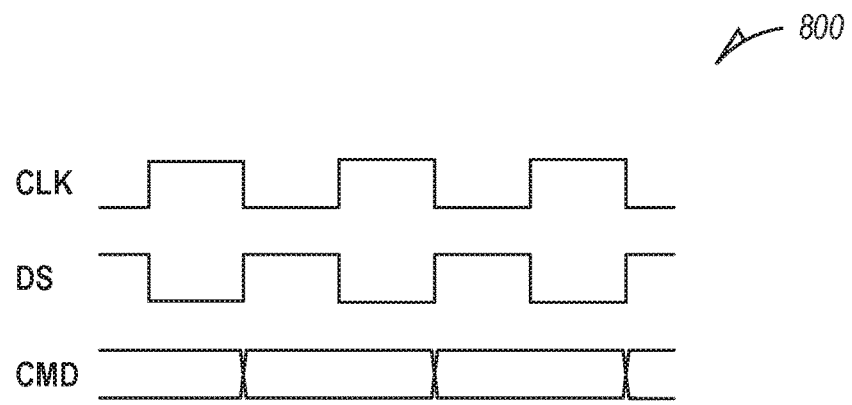

FIG. 8 illustrates an example timing diagram 800 including a clock signal (CLK), a data strobe signal (DS), and a command signal (CMD), in certain examples, the data strobe and command signals after having been delayed by a delay circuit. In this example, the command signal transitions at rising edges of the data strobe signal. In other examples, the command signal may transition at falling edges of the clock data strobe signal. The relationship between the data strobe signal and the command signal may be known, or detected, such as using error rates, rising and falling edge sampling registers, etc.

As illustrated in FIGS. 6 and 7, there are two ranges of invalid delay taps in the data strobe signal timing diagram 600, and a single range of invalid delay taps in the command signal timing diagram 700. The appropriate invalid range in the data strobe signal timing diagram 600 to set the value of the delay for the command signal can be selected using the relationship between the data strobe signal and the command signal, and moreover, the values of the data strobe signal at different delay taps. For example, if the SDR command signal transitions at rising edges of the DDR data strobe signal, and the command signal is sampled at rising edges, the invalid range in the data strobe signal timing diagram 600 would be that in which the value of the rising edge of the clock signal transitions from all "1" values to all "0" values, or in which the value of the falling edge of the clock signal transitions from all "0" values to all "1" values. The other invalid range in the data strobe signal timing diagram 600 is valid for the command signal timing diagram 700.

In other examples, the command signal can be sampled using a sampling register on rising and falling edges of the clock signal to determine a desired delay value, or a desired delay tap, such as using a midpoint of a range of valid delay taps.

Figure 9:
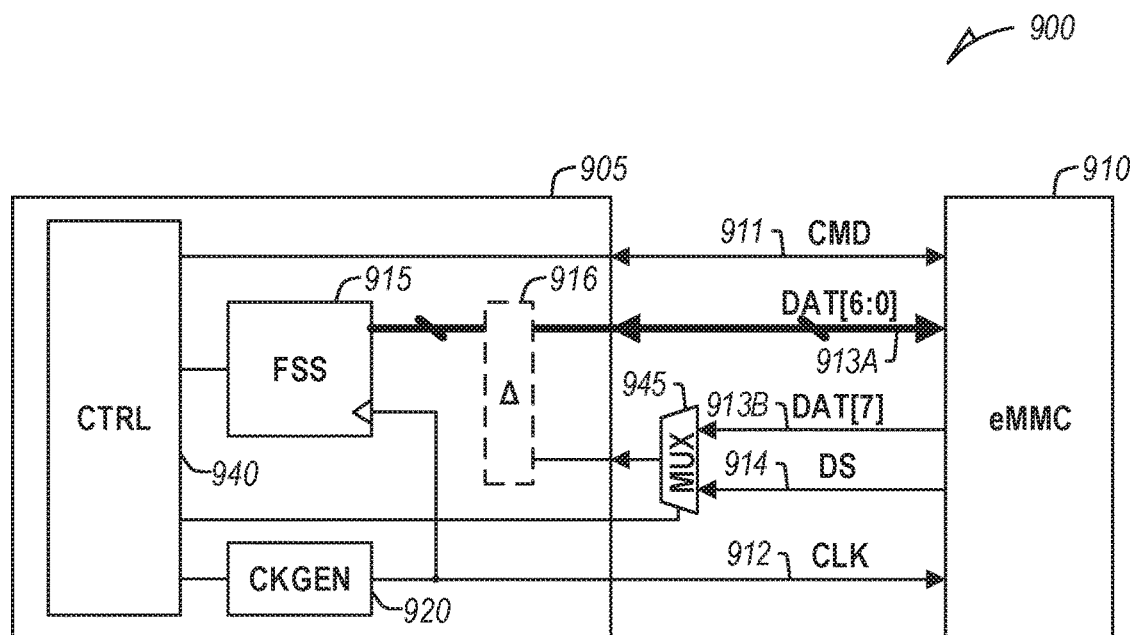
FIG. 9 illustrates an example portion of an eMMC system.

FIG. 9 illustrates an example portion of an eMMC system 900 including a host 905, an eMMC 910, and a communication interface including a command line (CMD) 911, a clock line (CLK) 912, a first set of data lines (DAT[6:0]) 913A, an additional data line (DAT[7]) 913B, and a data strobe line (DS) 914. In an example, the host 905 may not have a dedicated data strobe pin. The present inventors have recognized, among other things, that data strobe functionality in such hosts can be maintained using additional hardware between the eMMC 910 and the host 905. In an example, such as in a calibration mode, one of the existing data pins on the host can be used as a data strobe pin. With additional hardware between the eMMC 910 and the host 905, such as a multiplexer circuit or other component, the data pin can be used as the data strobe pin for calibration or determination of one or more delay values, such as in a calibration mode, and then switched back to being used as a data pin, such as in a data read mode. The host 905 can control transitions between the calibration mode (e.g., where the multiplexer circuit or other component provides the data strobe signal, or a signal consistent with a data strobe signal (1-0-1-0 . . . ) to the host 905) and the data read mode (e.g., where the multiplexer circuit or other component provides read data or a data signal to the host 905). Using an additional hardware component to implement the data strobe feature can be advantageous in that the data strobe features of the eMMC 910 can be used in conjunction with the host 905 without the dedicated pin with little to no changes in the data strobe feature of the eMMC 910.

In an example, the eMMC system 900 can include a multiplexer circuit (MUX) 945 configured to receive the additional data line 913B and the data strobe line 914 and provide a single input to the host 905, which may not include a dedicated data strobe pin. In an example, the multiplexer circuit 945 can be chosen to avoid timing issues impacting system performance (e.g., 200 MHz DDR, etc.), and can be bidirectional, such as to communicate information from the eMMC 910 to the host 905, or from the host 905 to the eMMC 910. Although illustrated in FIG. 9 as the first set of data lines being DAT0 through DAT6, and the additional data line as DAT7, in other examples, the data line used in combination with the data strobe line 914 as input to the multiplexer circuit 945 can include any existing data line (e.g., any one or more of DAT[0:7]). In an example, the selection of the additional data line 913B can be determined by a printed circuit board designer, in certain examples, in accordance with data path balance, or one or more other design considerations. Using the multiplexer circuit 945, the eMMC system 900 can implement the delay calibration procedures described herein, including determining an optimal delay value for each of one or more delay circuits in the eMMC system 900, such as a data delay circuit 916.

The host 905 can include a first sampling stage circuit (FSS) 915 or other sampling circuit configured to sample data on the first set of data lines 913A and the output of the multiplexer circuit 945, including data from the additional data line 913B and the data strobe line 914. The host 905 can include a clock generator circuit (CKGEN) 920 configured to provide a clock signal to the eMMC 910 using the clock line 912, and a host control circuit (CTRL) 940 configured to control one or more host processes. In an example, the host control circuit 940 can send or receive commands to or from the eMMC 910, perform operations or instructions, or communicate or control one or more other component of the eMMC system 900, including in certain examples, the multiplexer circuit 945, such as using one or more generic input/output (I/O) pins.

From a hardware standpoint, only the addition of the multiplexer circuit 945 and the connection of the multiplexer circuit 945 to the host 905 (e.g., using general-purpose I/O, etc.) are required to implement the data strobe features in an eMMC system 900 having a host 905 without a dedicated data strobe pin. The hardware of the host 905 and the eMMC 910 can remain unchanged. In certain examples, the additional changes required to implement the data strobe feature can be made in software of the eMMC system 900.

As the host 905 provides command signals to the eMMC 910 (and receives command signal from the eMMC 910), the host 905 is generally aware when to expect data from the eMMC 910 over the communication interface. The selection of the multiplexer circuit 945 can be done synchronous with data transfer, taking into account that in normal data strobe operation, the data strobe signal is only working when the eMMC 910 is providing data to the host 905. Accordingly, measurement of the delay between the host 905 and the eMMC 910, or calibration of the clock signal to the data, data strobe, or command signals, can be provided at various times, in certain examples, alternating with read or other operations. In an example, the process can be implemented in phases. For example, the value of the data delay circuit 916 can be set for each possible delay value (e.g., 32 delay values, or one or more other delay values over a period of the clock signal). The received data can be processed to identify the data strobe signal. The results can be evaluated, and the optimal delay value can be determined or selected. Then the determined or selected delay value can be applied to the data lines, such as using the data delay circuit 916 or one or more other delay circuits (e.g., including one or more other delay circuits on one or more other lines of the communication interface).

In an example, the control circuit 940 can control the multiplexer circuit 945, switching between the data signal and the data strobe signal. The data strobe signal can be sampled, such as using one or more of the circuits or methods described here, for example, with respect to the internal host clock, such as from the clock generator circuit 920. The delay applied to the data strobe signal (e.g., using the data delay circuit 916) can be changed, with the results of the sampling stored according to the applied delay. The results can be evaluated, and the optimal delay value can be selected (e.g., such that the valid range of delay taps is as wide as possible around the sampling edges) and applied to one or more lines of the communication interface, including one or more of the data lines 913A, the additional data line 913B, the data strobe line 914, the command line 911, etc.

In an example, the host 905 can determine or calibrate the optimal delay value using a data strobe signal through the multiplexer circuit 945 in response to a read command in high-speed mode from the eMMC 910. In an example, the host 905 can request the read command from the eMMC 910 to determine the optimal delay value, and as such, the sampled data values on the first set of data lines 913A can be ignored. After sending the read command, the host 905 can wait for a start bit on the data lines. The absence of a start bit can lead to a timeout of the read command. In an example, the data line used to recognize the start bit should not be used as the additional data line to be multiplexed with the data strobe line, such as to avoid misdetection of the start bit. Further, it is possible to invert the data strobe signal in the eMMC 910, or between the eMMC 910 and the multiplexer circuit 945, before routing the data strobe signal to the multiplexer circuit 945. Once the delay value is determined or calibrated, the multiplexer circuit 945 can switch to the additional data line 913B, and the first sampling stage 915 can read and sample requested data. In an example, the first sampling stage 915 can include components such as illustrated in FIG. 5.

Figure 10:
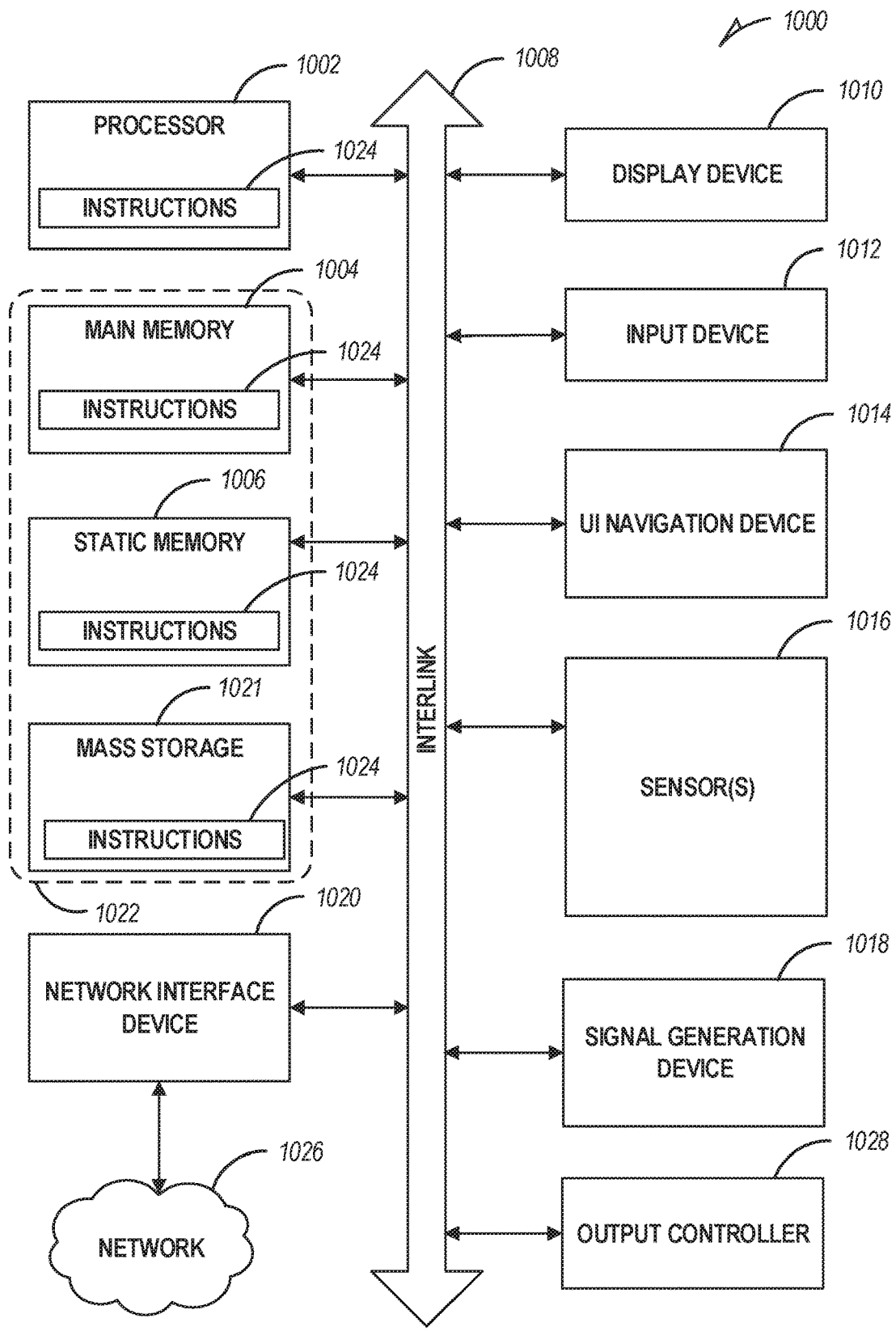
FIG. 10 illustrates a block diagram of an example machine upon which any one or more of the techniques (e.g., methodologies) discussed herein may perform.

FIG. 10 illustrates a block diagram of an example machine 1000 upon which any one or more of the techniques (e.g., methodologies) discussed herein may perform, such as triggering a CSAVE operation in a memory device (e.g., an NVDIMM) using a timer implemented using a memory controller of the NVDIMM. In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1000 (e.g., the host 105, the NVDIMM 110, etc.) may include a hardware processor 1002 (e.g., a central processing unit (CPU), a graphics processing unit (GPU), a hardware processor core, or any combination thereof, such as a memory controller, etc.), a main memory 1004 and a static memory 1006, some or all of which may communicate with each other via an interlink (e.g., bus) 1008. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1000 may include a machine-readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the mass storage 1021 may constitute the machine-readable medium 1022.

While the machine-readable medium 1022 is illustrated as a single medium, the term "machine-readable medium" may include a single medium or multiple media (e.g., a centralized or distributed database, or associated caches and servers) configured to store the one or more instructions 1024.

The term "machine-readable medium" may include any medium that is capable of storing, encoding, or carrying instructions for execution by the machine 1000 and that cause the machine 1000 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the storage device 1021, can be accessed by the memory 1004 for use by the processor 1002. The memory 1004 (e.g., DRAM) is typically fast, but volatile, and thus a different type of storage than the storage device 1021 (e.g., an SSD), which is suitable for long-term storage, including while in an "off" condition. The instructions 1024 or data in use by a user or the machine 1000 are typically loaded in the memory 1004 for use by the processor 1002. When the memory 1004 is full, virtual space from the storage device 1021 can be allocated to supplement the memory 1004; however, because the storage 1021 device is typically slower than the memory 1004, and write speeds are typically at least twice as slow as read speeds, use of virtual memory can greatly reduce user experience due to storage device latency (in contrast to the memory 1004, e.g., DRAM). Further, use of the storage device 1021 for virtual memory can greatly reduce the usable lifespan of the storage device 1021.

In contrast to virtual memory, virtual memory compression (e.g., the Linux™ kernel feature "ZRAM") uses part of the memory as compressed block storage to avoid paging to the storage device 1021. Paging takes place in the compressed block until it is necessary to write such data to the storage device 1021. Virtual memory compression increases the usable size of memory 1004, while reducing wear on the storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1024 may further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1000, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

An example (e.g., "Example 1") of subject matter (e.g., a system) can include a host device; and a multiplexer circuit configured to receive a data signal and a data strobe signal from an embedded MultiMediaCard (eMMC) device, and to selectively provide one of the data signal or the data strobe signal to a data pin of the host device, wherein the host device is configured to receive an output of the multiplexer circuit at a data pin of the host device, and to determine a timing relationship between the data strobe signal received from the multiplexer circuit at the data pin and an internal clock signal.

In Example 2, the subject matter of Example 1 can optionally be configured such that the host device is configured to control the multiplexer circuit, the multiplexer circuit is configured to provide the data signal at the output in a data read mode, and the data strobe signal at the output in a calibration mode, and the host device is configured to receive the data strobe signal from the multiplexer circuit in the calibration mode, and to determine the timing relationship between the data strobe signal received from the multiplexer circuit at the data pin and the internal clock signal in the calibration mode.

In Example 3, the subject matter of any one or more of Examples 1-2 can optionally be configured such that the host device includes: a delay circuit configured to delay the received output of the multiplexer circuit from the data pin by a configurable delay value; and a sampling circuit configured to sample the output of the multiplexer circuit at a transition of the internal clock signal, wherein the host device is configured to adjust the delay value of the delay circuit using the determined timing relationship to align the output of the multiplexer circuit and the internal clock signal for sampling.

In Example 4, the subject matter of any one or more of Examples 1-3 can optionally be configured such that the host device includes: a delay circuit configured to delay the received output of the multiplexer circuit from the data pin by a configurable delay value; and a sampling circuit configured to sample the output of the multiplexer circuit at a transition of the internal clock signal, wherein the host device is configured to adjust the delay value of the delay circuit, and to sample the output of the multiplexer circuit at different delay values to determine an alignment between the output of the multiplexer circuit and the internal clock signal.

In Example 5, the subject matter of any one or more of Examples 1-4 can optionally be configured such that the host device includes a set of data pins, wherein the data pin is one of the set of data pins and the host device does not include a dedicated data strobe pin.

In Example 6, the subject matter of any one or more of Examples 1-5 can optionally be configured to include the eMMC device including a data pin corresponding to the data pin of the host device and a dedicated data strobe pin configured to provide the data strobe signal in a high-speed mode, wherein the multiplexer circuit includes: a first input coupled to a data pin of the eMMC device configured to receive read data from the eMMC device; a second input coupled to a data strobe pin of the eMMC device configured to receive the data strobe signal from the eMMC device; an output coupled to a corresponding data pin of the host device; and a control input coupled to a general-purpose input/output (GPIO) pin of the host device.

In Example 7, the subject matter of any one or more of Examples 1-6 can optionally be configured such that, in a calibration mode, the host device is configured to: provide a control signal to the multiplexer circuit using the GPIO pin to couple the data strobe pin of the eMMC device to the output of the multiplexer circuit; provide a read command to the eMMC device configured to trigger the eMMC device to provide the data strobe signal on the data strobe pin; receive the data strobe signal from the multiplexer circuit at the data pin of the host device; and determine the timing relationship between the data strobe signal received at the data pin of the host device from the multiplexer circuit.

In Example 8, the subject matter of any one or more of Examples 1-7 can optionally be configured such that, in a data read mode, the host device is configured to: provide a control signal to the multiplexer circuit using the GPIO pin to couple the data pin of the eMMC device to the output of the multiplexer circuit; provide a read command to the eMMC device; and receive read data from the multiplexer circuit at the data pin of the host device.

In Example 9, the subject matter of any one or more of Examples 1-8 can optionally be configured such that, in the data read mode, the multiplexer circuit is configured to receive the data strobe signal from the eMMC device, but is not configured to provide the data strobe signal to the host device.

In Example 10, the subject matter of any one or more of Examples 1-9 can optionally be configured such that the host device is configured to intermittently trigger the calibration mode to determine the timing relationship between the data strobe signal and the internal clock signal, and to control a delay value of a delay circuit using the determined timing relationship.

An example (e.g., "Example 11") of subject matter (e.g., a method) can include: receiving a data signal and a data strobe signal at a host device from an embedded MultiMediaCard (eMMC) device at a multiplexer circuit; selectively providing, using the multiplexer circuit, one of the data signal or the data strobe signal to a data pin of the host device; receiving an output of the multiplexer circuit at a data pin of the host device; and determining, using the host device, a timing relationship between the data strobe signal received from the multiplexer circuit at the data pin and an internal clock signal to control a delay circuit of the host device.

In Example 12, the subject matter of Example 11 can optionally be configured to include controlling the multiplexer circuit using the host device to provide the data signal at the output in a data read mode, and the data strobe signal at the output in a calibration mode; receiving the data strobe signal from the multiplexer circuit at the host device in the calibration mode; and wherein determining the timing relationship between the data strobe signal received from the multiplexer circuit at the data pin and the internal clock signal includes in determining the timing relationship in the calibration mode.

In Example 13, the subject matter of any one or more of Examples 11-12 can optionally be configured to include delaying the received output of the multiplexer circuit from the data pin by a configurable delay value using a delay circuit in the host device; sampling the output of the multiplexer circuit at a transition of the internal clock signal using a sampling circuit in the host device; adjusting, using the host device, the delay value of the delay circuit using the determined timing relationship to align the output of the multiplexer circuit and the internal clock signal for sampling.

In Example 14, the subject matter of any one or more of Examples 11-13 can optionally be configured to include delaying the received output of the multiplexer circuit from the data pin of the host device by a configurable delay value using a delay circuit in the host device; adjusting, using the host device, the delay value of the delay circuit; and sampling the output of the multiplexer circuit at a transition of the internal clock signal using a sampling circuit in the host device at different delay values to determine an alignment between the output of the multiplexer circuit and the internal clock signal.

In Example 15, the subject matter of any one or more of Examples 11-14 can optionally be configured such that the host device does not include a dedicated data strobe pin.

In Example 16, the subject matter of any one or more of Examples 11-15 can optionally be configured to include providing the data strobe signal at the data strobe pin of the eMMC device in response to a read request in a high-speed mode of the eMMC device; receiving read data from the eMMC device at a first input of the multiplexer circuit; receiving the data strobe signal from the eMMC device in the high-speed mode at a second input of the multiplexer circuit; controlling an output of the multiplexer circuit using a general-purpose input/output (GPIO) pin of the host device.

In Example 17, the subject matter of any one or more of Examples 11-16 can optionally be configured to include, in a calibration mode of the host device: providing a control signal to the multiplexer circuit using the GPIO pin to couple the data strobe pin of the eMMC device to the output of the multiplexer circuit; providing a read command to the eMMC device to trigger the eMMC device to provide the data strobe signal on the data strobe pin; receiving the data strobe signal from the multiplexer circuit at the data pin of the host device; and determining the timing relationship between the data strobe signal received at the data pin of the host device from the multiplexer circuit.

In Example 18, the subject matter of any one or more of Examples 11-17 can optionally be configured to include, in a data read mode of the host device: providing a control signal to the multiplexer circuit using the GPIO pin to couple the data pin of the eMMC device to the output of the multiplexer circuit; providing a read command to the eMMC device to trigger the eMMC device to provide read data to the data pin; and receiving read data from the multiplexer circuit at the data pin of the host device.

In Example 19, the subject matter of any one or more of Examples 11-18 can optionally be configured to include, in the data read mode: receiving the data strobe signal from the eMMC device at the multiplexer circuit, but not providing the data strobe signal to the host device.

In Example 20, the subject matter of any one or more of Examples 11-19 can optionally be configured to include intermittently triggering, using the host device, the calibration mode to determine the timing relationship between the data strobe signal and the internal clock signal, and controlling, using the host device, a delay value of a delay circuit using the determined timing relationship.

An example (e.g., "Example 21") of subject matter (e.g., a system) can include: a host device configured to receive read data from an embedded MultiMediaCard (eMMC) device over data lines of a communication interface and a data strobe signal from the eMMC device over a data strobe line of the communication interface, wherein the host device is configured to determine a timing relationship between the data strobe signal and an internal clock signal to align the read data for sampling.

In Example 22, the subject matter of Example 21 can optionally be configured such that the host device is configured to determine the timing relationship between the data strobe signal and the internal clock signal in a calibration mode to align the read data for sampling, and the host device is configured to receive read data from the eMMC device over the data strobe line in a data mode separate from calibration mode.

In Example 23, the subject matter of any one or more of Examples 21-22 can optionally be configured such that the host device includes: data pins configured to receive read data from the eMMC device over the data lines of the communication interface; and a data strobe pin configured to receive the data strobe signal from the eMMC device over a data strobe line of the communication interface, wherein the host device is configured to receive read data from the eMMC device over at the data pins in both the calibration mode and the data mode.

In Example 24, the subject matter of any one or more of Examples 21-23 can optionally be configured such that the host device is configured to provide a command to the eMMC device to provide read data over the data strobe line of the communication interface in the data mode.

In Example 25, the subject matter of any one or more of Examples 21-24 can optionally be configured such that the data pins consist of a number (N) of data pins, and the host is configured to receive read data from the eMMC device using the N data pins and the data strobe pin, collectively N+1 pins, in the data mode.

In Example 26, the subject matter of any one or more of Examples 1-25 can optionally be configured such that a data delay circuit configured to delay the received read data in the host device by a configurable delay value; and a sampling circuit configured to sample the read data at a transition of the internal clock signal, wherein the host device is configured to adjust the delay value of the data delay circuit using the determined timing relationship to align the read data and the internal clock signal for sampling.

In Example 27, the subject matter of any one or more of Examples 21-26 can optionally be configured such that a data strobe delay circuit configured to delay the received data strobe signal by a configurable delay value; and a measurement circuit configured to determine the timing relationship between the data strobe signal and the internal clock signal, wherein the host device is configured to adjust the delay value of the data strobe delay circuit using the determined timing relationship.

In Example 28, the subject matter of any one or more of Examples 21-27 can optionally be configured such that a data strobe delay circuit configured to delay the received data strobe signal by a configurable delay value, wherein the host device is configured to adjust the delay value of the data strobe delay circuit, and to sample the data strobe signal at different delay values to determine the timing relationship between the data strobe signal and the internal clock signal.

In Example 29, the subject matter of any one or more of Examples 21-28 can optionally be configured such that the host device is configured to trigger determination of the timing relationship.

An example (e.g., "Example 30") of subject matter (e.g., a method) can include: receiving read data at a host device from an embedded MultiMediaCard (eMMC) device over data lines of a communication interface; receiving a data strobe signal at the host device from the eMMC device over a data strobe line of the communication interface; and determining, using the host device, a timing relationship between the data strobe signal and an internal clock signal to align the read data for sampling.

In Example 31, the subject matter of Example 30 can optionally be configured to include determining the timing relationship between the data strobe signal and the internal clock signal using the host device in a calibration mode to align the read data for sampling; and receiving read data from the eMMC device over the data strobe line using the host device in a data mode separate from calibration mode.

In Example 32, the subject matter of any one or more of Examples 30-31 can optionally be configured such that receiving read data at the host device includes receiving read data from the eMMC device over the data lines of the communication interface at data pins of the host device in both the calibration mode and the data mode, and receiving the data strobe signal includes receiving the data strobe signal from the eMMC device over a data strobe line of the communication interface at a data strobe pin.

In Example 33, the subject matter of any one or more of Examples 32 can optionally be configured to include providing a command to the eMMC device, using the host device, to provide read data over the data strobe line of the communication interface in the data mode.

In Example 34, the subject matter of any one or more of Examples 30-33 can optionally be configured such that the data pins consist of a number (N) of data pins, and wherein receiving read data from the eMMC device includes using the N data pins and the data strobe pin, collectively N+1 pins, in the data mode.

In Example 35, the subject matter of any one or more of Examples 30-34 can optionally be configured to include: delaying the received read data in the host device by a configurable delay value using a data delay circuit; sampling the read data at a transition of the internal clock signal using a sampling circuit; and adjusting, using the host device, the delay value of the data delay circuit using the determined timing relationship to align the read data and the internal clock signal for sampling.

In Example 36, the subject matter of any one or more of Examples 30-35 can optionally be configured to include: delaying the received data strobe signal by a configurable delay value using a data strobe delay circuit; determining the timing relationship between the data strobe signal and the internal clock signal using a measurement circuit; and adjusting, using the host device, the delay value of the data strobe delay circuit using the determined timing relationship.

In Example 37, the subject matter of any one or more of Examples 30-36 can optionally be configured to include: delaying the received data strobe signal by a configurable delay value using a data strobe delay circuit; adjusting the delay value of the data strobe delay circuit using the host device; and sampling the data strobe signal at different delay values to determine the timing relationship between the data strobe signal and the internal clock signal using the host device.

In Example 38, the subject matter of any one or more of Examples 30-37 can optionally be configured to include triggering determination of the timing relationship using the host device.

An example (e.g., "Example 39") of subject matter (e.g., a device readable storage medium) can provide instructions that, when executed by a controller of a host device cause the controller to perform operations comprising: receive read data from an embedded MultiMediaCard (eMMC) device over data lines of a communication interface; receive a data strobe signal at the host device from the eMMC device over a data strobe line of the communication interface; and determining a timing relationship between the data strobe signal and an internal clock signal to align the read data for sampling.

In Example 40, the subject matter of Example 39 can optionally be configured such that determining the timing relationship includes: determine the timing relationship between the data strobe signal and the internal clock signal using the host device in a calibration mode to align the read data for sampling; and receive read data from the eMMC device over the data strobe line using the host device in a data mode separate from calibration mode.

Example 41 is an apparatus comprising respective means for performing any of the methods or techniques of Examples 1-40.

Example 42 is a system, apparatus, or device to perform the operations of any of Examples 1-41.

Example 43 is a tangible machine-readable medium embodying instructions to perform or implement the operations of any of Examples 1-42.

Example 44 is a method to perform the operations of any of Examples 1-43.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system comprising:
a host device configured to receive read data from an embedded MultiMediaCard (eMMC) device over data lines of a communication interface and a data strobe signal from the eMMC device over a data strobe line of the communication interface,
wherein the host device is configured to determine a timing relationship between the data strobe signal and an internal clock signal in a calibration mode to align the read data for sampling, and
wherein the host device is configured to receive read data from the eMMC device over the data strobe line in a data mode separate from calibration mode.

2. The system of claim 1, wherein the host device includes:
data pins configured to receive read data from the eMMC device over the data lines of the communication interface; and
a data strobe pin configured to receive the data strobe signal from the eMMC device over a data strobe line of the communication interface,
wherein the host device is configured to receive read data from the eMMC device over at the data pins in both the calibration mode and the data mode.

3. The system of claim 2, wherein the host device is configured to provide a command to the eMMC device to provide read data over the data strobe line of the communication interface in the data mode.

4. The system of claim 2, wherein the data pins consist of a number (N) of data pins, and wherein the host is configured to receive read data from the eMMC device using the N data pins and the data strobe pin, collectively N+1 pins, in the data mode.

5. The system of claim 1, including:
a data delay circuit configured to delay the received read data in the host device by a configurable delay value; and
a sampling circuit configured to sample the read data at a transition of the internal clock signal,
wherein the host device is configured to adjust the delay value of the data delay circuit using the determined timing relationship to align the read data and the internal clock signal for sampling.

6. The system of claim 1, including:
a data strobe delay circuit configured to delay the received data strobe signal by a configurable delay value; and
a measurement circuit configured to determine the timing relationship between the data strobe signal and the internal clock signal,
wherein the host device is configured to adjust the delay value of the data strobe delay circuit using the determined timing relationship.

7. The system of claim 1, including:
a data strobe delay circuit configured to delay the received data strobe signal by a configurable delay value,
wherein the host device is configured to adjust the delay value of the data strobe delay circuit, and to sample the data strobe signal at different delay values to determine the timing relationship between the data strobe signal and the internal clock signal.

8. The system of claim 1, wherein the host device is configured to trigger determination of the timing relationship.

9. A method comprising:
receiving read data at a host device from an embedded MultiMediaCard (eMMC) device over data lines of a communication interface;
receiving a data strobe signal at the host device from the eMMC device over a data strobe line of the communication interface;
determining, using the host device in a calibration mode, a timing relationship between the data strobe signal and an internal clock signal to align the read data for sampling; and
receiving read data from the eMMC device over the data strobe line using the host device in a data mode separate from calibration mode.

10. The method of claim 9, wherein receiving read data at the host device includes receiving read data from the eMMC device over the data lines of the communication interface at data pins of the host device in both the calibration mode and the data mode, and
wherein receiving the data strobe signal includes receiving the data strobe signal from the eMMC device over a data strobe line of the communication interface at a data strobe pin.

11. The method of claim 10, including:
providing a command to the eMMC device, using the host device, to provide read data over the data strobe line of the communication interface in the data mode.

12. The method of claim 10, wherein the data pins consist of a number (N) of data pins, and wherein receiving read data from the eMMC device includes using the N data pins and the data strobe pin, collectively N+1 pins, in the data mode.

13. The method of claim 9, including:
delaying the received read data in the host device by a configurable delay value using a data delay circuit;
sampling the read data at a transition of the internal clock signal using a sampling circuit; and
adjusting, using the host device, the delay value of the data delay circuit using the determined timing relationship to align the read data and the internal clock signal for sampling.

14. The method of claim 9, including:
delaying the received data strobe signal by a configurable delay value using a data strobe delay circuit;
determining the timing relationship between the data strobe signal and the internal clock signal using a measurement circuit; and
adjusting, using the host device, the delay value of the data strobe delay circuit using the determined timing relationship.

15. The method of claim 9, including:
delaying the received data strobe signal by a configurable delay value using a data strobe delay circuit;
adjusting the delay value of the data strobe delay circuit using the host device; and
sampling the data strobe signal at different delay values to determine the timing relationship between the data strobe signal and the internal clock signal using the host device.

16. The method of claim 9, including:
triggering determination of the timing relationship using the host device.

17. A non-transitory device readable storage medium that provides instructions that, when executed by a controller of a host device cause the controller to perform operations comprising:
receive read data from an embedded MultiMediaCard (eMMC) device over data lines of a communication interface;
receive a data strobe signal at the host device from the eMMC device over a data strobe line of the communication interface;
determine a timing relationship between the data strobe signal and an internal clock signal using the host device in a calibration mode to align the read data for sampling; and
receive read data from the eMMC device over the data strobe line using the host device in a data mode separate from calibration mode.

18. A system comprising:
a host device configured to receive read data from an embedded MultiMediaCard (eMMC) device over data lines of a communication interface and a data strobe signal from the eMMC device over a data strobe line of the communication interface;
a data delay circuit configured to delay the received read data in the host device by a configurable delay value; and
a sampling circuit configured to sample the read data at a transition of the internal clock signal,
wherein the host device is configured to determine a timing relationship between the data strobe signal and an internal clock signal and adjust the delay value of the data delay circuit using the determined timing relationship to align the read data and the internal clock signal for sampling.

19. The system of claim 18, wherein the host device is configured to determine the timing relationship between the data strobe signal and the internal clock signal in a calibration mode to align the read data for sampling, and
wherein the host device is configured to receive read data from the eMMC device over the data strobe line in a data mode separate from calibration mode.

20. A method comprising:
receiving read data at a host device from an embedded MultiMediaCard (eMMC) device over data lines of a communication interface;
receiving a data strobe signal at the host device from the eMMC device over a data strobe line of the communication interface;
delaying the received read data in the host device by a configurable delay value using a data delay circuit;
sampling the read data at a transition of the internal clock signal using a sampling circuit; and
determining, using the host device, a timing relationship between the data strobe signal and an internal clock signal, and adjusting the delay value of the data delay circuit using the determined timing relationship to align the read data and the internal clock signal for sampling.

21. The method of claim 20, wherein determining the timing relationship between the data strobe signal and the internal clock signal comprises using the host device in a calibration mode, the method further comprising:
receiving read data from the eMMC device over the data strobe line using the host device in a data mode separate from calibration mode.

22. A non-transitory device readable storage medium that provides instructions that, when executed by a controller of a host device cause the controller to perform operations comprising:
receive read data at a host device from an embedded MultiMediaCard (eMMC) device over data lines of a communication interface;
receive a data strobe signal at the host device from the eMMC device over a data strobe line of the communication interface;
delay the received read data in the host device by a configurable delay value using a data delay circuit;
sample the read data at a transition of the internal clock signal using a sampling circuit; and
determine, using the host device, a timing relationship between the data strobe signal and an internal clock signal, and adjust the delay value of the data delay circuit using the determined timing relationship to align the read data and the internal clock signal for sampling.

23. The device readable storage medium of claim 22, wherein, to determine the timing relationship between the data strobe signal and the internal clock signal comprises using the host device in a calibration mode, the operations further comprising:
receive read data from the eMMC device over the data strobe line using the host device in a data mode separate from calibration mode.

* * * * *